(12) United States Patent
Kollipara (10) Patent No.: US 6,681,338 B1
(45) Date of Patent: Jan. 20, 2004

(54) METHOD AND SYSTEM FOR REDUCING SIGNAL SKEW BY SWITCHING BETWEEN MULTIPLE SIGNAL ROUTING LAYERS

(75) Inventor: Ravindranath T. Kollipara, Fremont, CA (US)

(73) Assignee: Rambus, Inc., Los Altos, CA (US)

( * ) Notice: Subject to any disclaimer, the term of this patent is extended or adjusted under 35 U.S.C. 154(b) by 585 days.

(21) Appl. No.: 09/599,091

(22) Filed: Jun. 21, 2000

(51) Int. Cl.⁷ .............................................. G06F 1/04
(52) U.S. Cl. ..................... 713/503; 716/12; 711/105
(58) Field of Search ..................... 713/503; 365/52; 327/141; 711/105; 714/700; 716/12

(56) References Cited

U.S. PATENT DOCUMENTS

| | | | | |
|---|---|---|---|---|
| 5,391,917 A | * | 2/1995 | Gilmour et al. | 257/690 |
| 5,467,040 A | * | 11/1995 | Nelson et al. | 327/276 |
| 5,861,764 A | * | 1/1999 | Singer et al. | 326/93 |
| 6,057,512 A | * | 5/2000 | Noda et al. | 174/250 |
| 6,067,594 A | * | 5/2000 | Perino et al. | 710/301 |
| 6,338,144 B2 | * | 1/2002 | Doblar et al. | 713/400 |
| 6,448,168 B1 | * | 9/2002 | Rao et al. | 438/598 |
| 6,513,149 B1 | * | 1/2003 | Donato | 716/12 |

FOREIGN PATENT DOCUMENTS

WO    WO-99-10989    * 3/1999

OTHER PUBLICATIONS

Technical Note TN1138, "High–Speed SDRAM Design Considerations," http://developer.apple.com/technotes/tn/pdf/tn1138.pdf, Aug. 31, 1998.*

* cited by examiner

Primary Examiner—Thomas Lee
Assistant Examiner—Eric Chang
(74) Attorney, Agent, or Firm—Lee & Hayes, PLLC (57) ABSTRACT

Methods and systems for reducing signal skew caused by dielectric material variations within one or more module substrates are described. In one embodiment, an elongate module substrate having a long axis includes multiple signal routing layers supported by the module substrate. Multiple devices, such as memory devices (e.g. DRAMs) are supported by the module substrate and are operably connected with the signal routing layers. Multiple skew-reducing locations (e.g. vias) within the module permit signals that are routed in two or more of the multiple signal routing layers to be switched to a different signal routing layer. The skew-reducing locations can be arranged in at least one line that is generally transverse the long axis of the module substrate. The lines of skew-reducing locations can be disposed at various locations on the module. For example, a line of skew-reducing locations can be disposed proximate the middle of the module to effectively offset skew. Multiple skew-reducing locations can be provided at other locations within the module as well so that the signals are switched multiple different times as they propagate through the module.

54 Claims, 6 Drawing Sheets

Fig. 5

METHOD AND SYSTEM FOR REDUCING SIGNAL SKEW BY SWITCHING BETWEEN MULTIPLE SIGNAL ROUTING LAYERS

TECHNICAL FIELD

This invention relates to skew-reducing systems and methods and, more particularly, concerns skew-reducing systems and methods for use in connection with In-line Memory Modules (IMMs), such as the RIMM® systems of Rambus Inc. (a corporation having a place of business in California).

BACKGROUND

As computer processors increase in speed they require increased information bandwidth from other subsystems supporting the processor. An example is the large amount of bandwidth needed by video and 3D image processing from a computer memory subsystem. Another example is a main memory subsystem. One or more high frequency buses are typically employed to provide the bandwidth required. The higher the frequency of operation of the bus, the greater the requirement that the signals on the bus have high-fidelity and equal propagation times to the devices making up the subsystem. High-fidelity signals are signals having little or no ringing and controlled and steady rising and falling edge rates. Many obstacles are encountered in assuring the uniform arrival times of high-fidelity signals to devices on the bus. One such obstacle is a requirement that a subsystem be modular, meaning that portions of a subsystem may be added and possibly removed. The modularity requirement implies that devices that are part of the modular subsystem be mounted on a separate substrate or module which couples to another board, the motherboard. It also implies the use of connectors if both addition and removal is required. Other obstacles are the number of layers of the motherboard on which routing of the bus is allowed and whether the bus is routed in a straight line or routed with turns. Too few layers on a motherboard, or a module, and turns of the lines may not permit the construction of the bus lines in a way necessary to achieve uniform arrival times of high-fidelity signals to devices on the bus.

Modular subsystems in computers have numerous advantages, some of which are field upgradability, replacement of a failing device, flexibility of initial configuration, and increased device density. Currently, so called DIMMs (dual in-line memory modules) and Rambus in-line memory modules (i.e. RIMM® systems) are examples of computer memory systems employing such modules. Because of these advantages and the desirability of having high performance modular memory subsystems, it is especially important to have buses with uniform arrival times to devices in applications where modules are employed.

A problem with such modules is that signal propagation delays can become introduced in the modules because of the nature of the material through which the signals are routed. More specifically, a typical module comprises a multi-layer circuit board structure with various conductive lines extending through the module separated by one or more dielectric material layers. High speed signals are typically propagated through the conductive lines to various devices that are located on the module. Because of variations in the dielectric properties of the dielectric material layer(s), however, signals that are desired to have no meaningful propagation delay differences are found to have undesirable propagation delay differences. This, in turn, can adversely affect compliance with timing budgets.

Accordingly, this invention arose out of concerns associated with providing improved systems and methods of using and forming such systems that have desirably minimal signal propagation delay differences.

SUMMARY

Methods and systems for reducing signal skew caused by dielectric material variations within one or more module substrates are described. In one embodiment, an elongate module substrate having a long axis includes multiple signal routing layers supported by the module substrate. Multiple devices, such as memory devices (e.g. DRAMs) are supported by the module substrate and are operably connected with the signal routing layers. Multiple skew-reducing locations (e.g. vias) within the module permit signals that are routed in two or more of the multiple signal routing layers to be switched to a different signal routing layer. The skew-reducing locations can be arranged in at least one line that is generally transverse the long axis of the module substrate. The lines of skew-reducing locations can be disposed at various locations on the module. For example, a line of skew-reducing locations can be disposed proximate the middle of the module to effectively offset skew. Multiple skew-reducing locations can be provided at other locations within the module as well so that the signals are switched multiple different times as they propagate through the module.

DETAILED DESCRIPTION

Overview

Typically, in modular subsystems, groups of signals are propagated through device modules along conductive lines that are provided at various levels within a module substrate, such as a printed circuit board (PCB) that supports various devices. It is desirable, in many instances, to propagate signals with little or no propagation delay differences as between the signals. Yet, because of material variations in the material utilized to form the substrate or PCB (e.g. the dielectric material utilized to provide insulation between the conductive lines), propagation delay differences can be undesirably introduced into signal groups.

In accordance with the embodiments described below, propagation delay differences between signal groups, or "skew" as it will be referred to, are addressed by switching the conductive layers through which each of the signal groups propagate at some point or points along the module. By switching the conductive layers through which the signals groups propagate, skew can be drastically reduced or, in some cases, canceled all together.

Exemplary Systems

Figure 1:
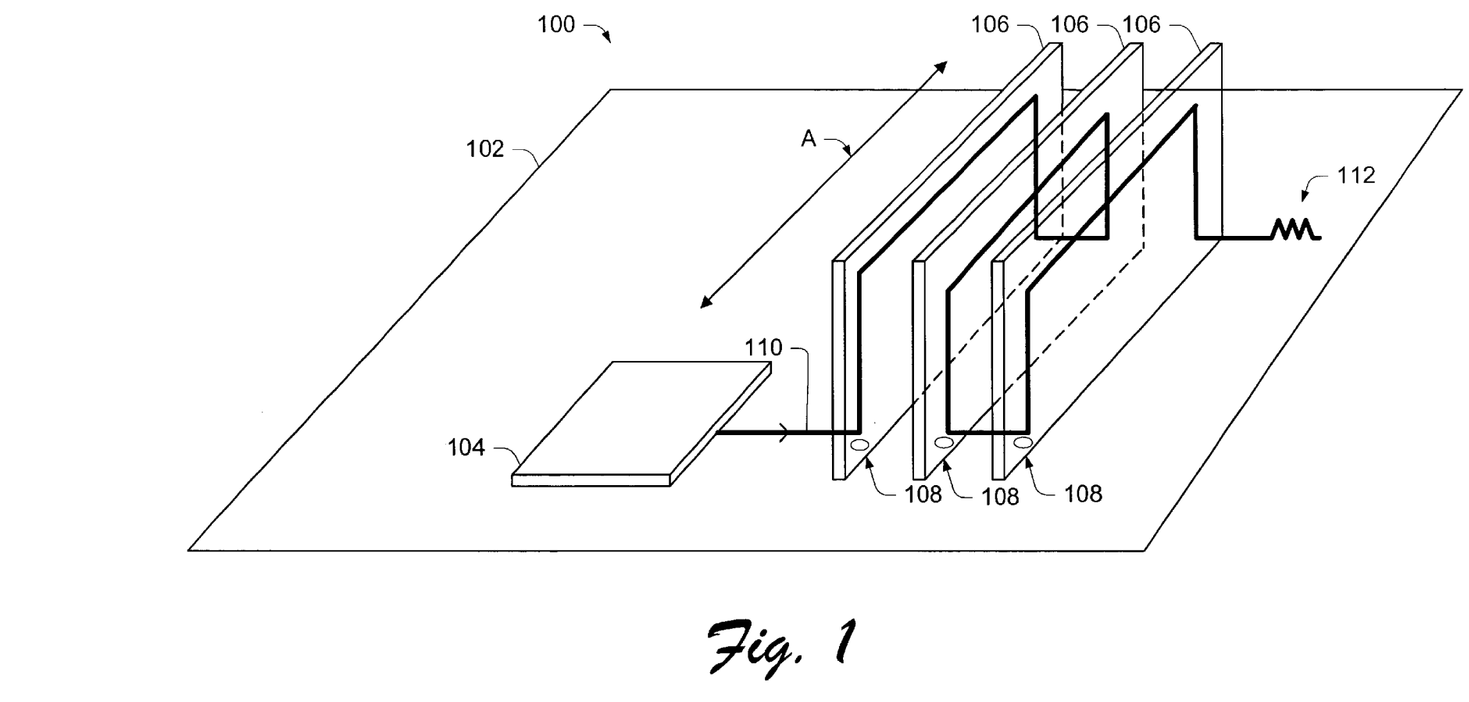
FIG. 1 is perspective view of an exemplary system in which the inventive embodiments can be employed.

FIG. 1 shows an exemplary perspective view of a system in which the inventive techniques described below can be implemented. In the described example, an In-line Memory Module (IMM) system known as a RIMM® is described. It will be appreciated, however, that the techniques described herein are applicable to systems other than the described RIMM® system.

System 100 includes a motherboard 102 which acts as a substrate to which a master 104, in the form of a memory controller, and various device modules 106 are coupled. In this example, the device modules are elongate and have a long axis in the direction of arrow A. Motherboard 102 can be formed from any suitable material. Typically, the motherboard is a printed circuit board. Any number of device modules can be utilized, with three modules being shown for exemplary purposes only. Master or memory controller 104 contains intelligence which enables it to control individual devices on each of the modules. In the RIMM® example, the individual devices on each module comprise dynamic random access memories (DRAMs). Each module has a marking or key 108 to assure that each module is coupled with the same orientation to the motherboard. A high frequency bus 110 is provided and is routed from master 104 on the motherboard, through each module 106, and finally to a terminator 112 on the motherboard in the form of a resistive device.

Figure 2:
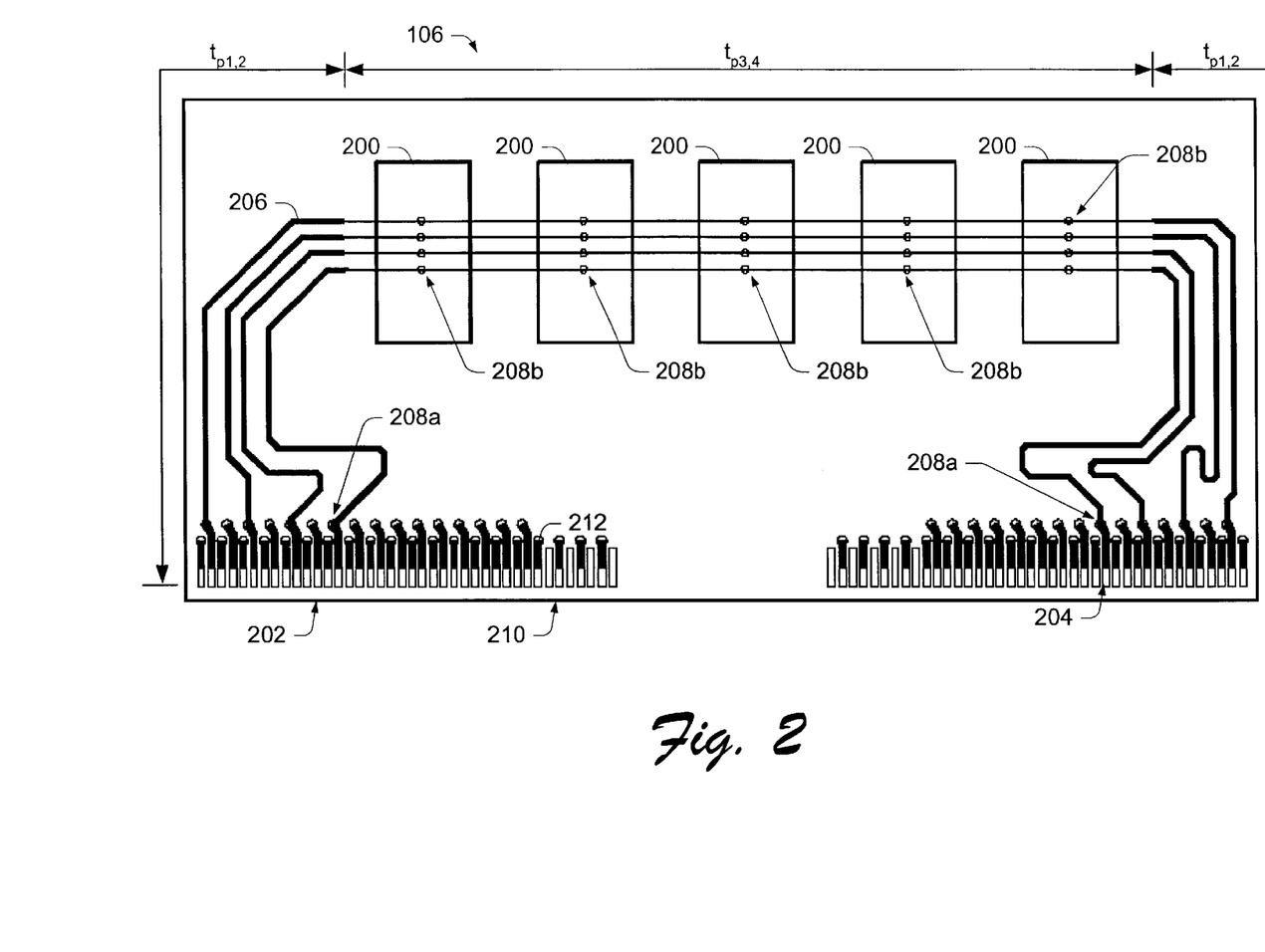
FIG. 2 is a top plan view of a module in which the inventive embodiments can be employed.

FIG. 2 shows a more detailed view of an individual module 106. Module 106 includes multiple devices 200 mounted on one side or both sides of the module. In the present example, such devices comprise DRAMs and the module is configured as a RIMM® system. The reader is assumed to have some familiarity with the operation of In-line memory modules, such as RIMM® systems. For additional background information, however, the reader is referred to U.S. Pat. No. 6,067,594, the disclosure of which is incorporated by reference herein.

The illustrated module includes a set of edge fingers 202, 204 for coupling to the motherboard and bus transmission lines 206 which enter the module on the edge fingers 202 of one side, are routed to two or more internal signal routing layers by vias 208a, traverse along the length of the module connecting to devices 200 on either side of the module by exemplary vias 208b disposed underneath the devices, and exit on the opposite side edge fingers 204 through vias 208a that connect with the edge fingers.

Also depicted are edge fingers 210 connecting to a reference plane within the module by means of lines 212. This preserves the relationship of grounds between signals as the signals pass through the connector joining the module to the motherboard.

Notches (not specifically shown) are provided on the side having the edge fingers and are used as a key to assure the proper orientation and electrical and parametric compatibility of the module when coupled to the motherboard. The notches may be used by a clamping or retaining device to hold the device module in place on the motherboard.

In the illustrated example, five exemplary devices 200 are shown mounted on the front face of module 106. There can also be five exemplary devices mounted on the back face (not shown) of the module. In various implementations, different numbers of devices can be mounted on a module. For example, there can be from 4 to 16 devices mounted on each module in conventional RIMM® system constructions. Other numbers of devices could, of course, be mounted on each module.

Figure 3:
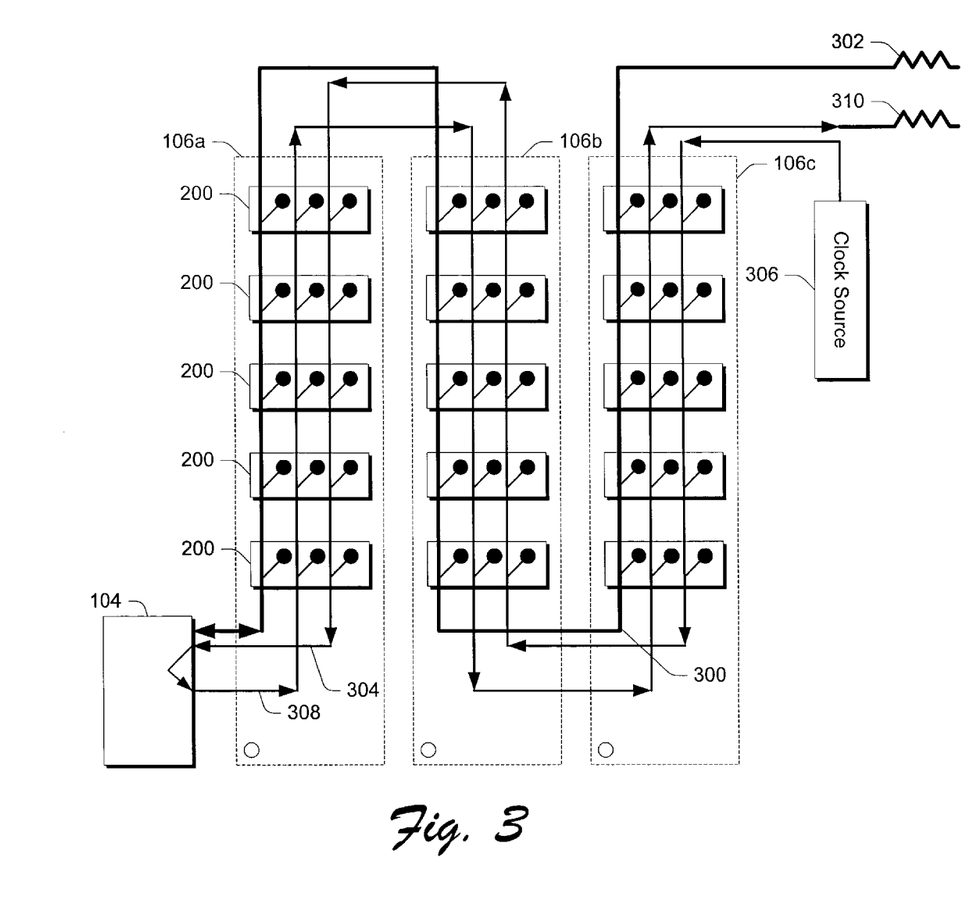
FIG. 3 is a diagram that shows routing of various high speed signals through exemplary modules.

FIG. 3 illustrates a view of an exemplary routing of a data transmission line and a clock transmission line in an exemplary system. Data line or lines 300 are routed on the motherboard from controller 104 to device module 106a. The lines then traverse the length of the module substantially parallel to the long side of the module and exit at the opposite end from the entry onto the module. Along the length of line 300 on the module, each device 200 that is situated on either side of the module is connected to the line. The line is routed on the motherboard again until it enters the next module 106b at one end, again traversing the length of the module substantially parallel to the long side of the module and exiting at the opposite end. At the exit from module 106c, line 300 then runs on the motherboard to a termination device 302. Clock line 304 starts at a clock source 306, enters module 106c, traverses the module connecting to each device, and exits from 106c onto the motherboard. The clock line 304 continues similarly until it reaches controller 104. Near or within controller 104 the clock line 304 is looped back to join to clock line 308 which travels back through the modules in a similar fashion to the routing for the data line. Upon exiting the module 106c the clock line runs on the motherboard to a termination device 310. In this example, it is important for the proper operation of the devices that the clock lines 304 and 308 be routed in a fashion similar to the data line 300 and that no relative changes in direction of propagation occur between the two lines. This means that if a signal is propagating on the data line 300 of module 106a away from the dot (the orientation dot shown in the lower left of each module) then the signal on the clock line 308 propagates in the same direction and the signal on clock line 304 propagates in the opposite direction. This relationship is preserved between the data line and the clock lines on the motherboard and on the other modules.

The above description constitutes but one exemplary description of a RIMM® system in which the inventive techniques discussed below can be employed. It is to be understood that the above description is intended only to educate the reader as to exemplary types of systems in which the below-described techniques can be employed.

High Speed Signal Routing

Figure 4:
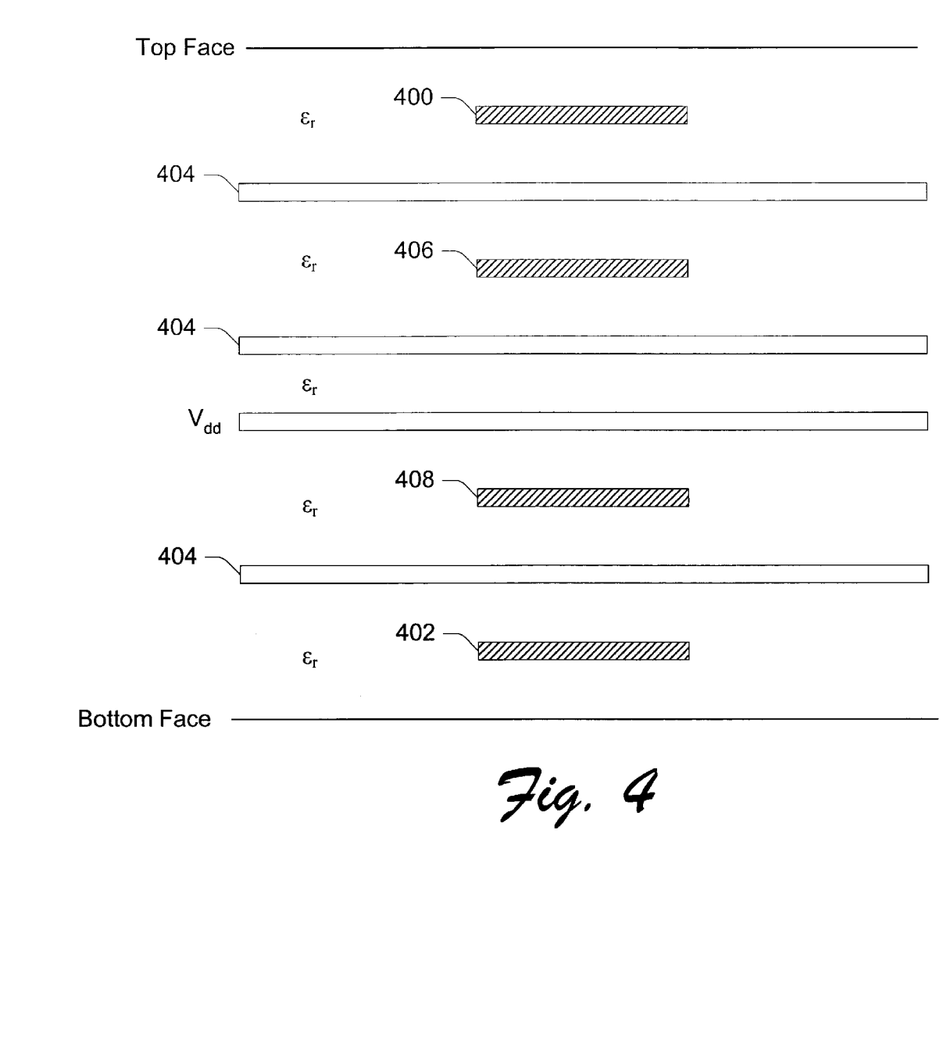
FIG. 4 is a sectional view of a module that describes various layers within the module.

FIG. 4 shows a cross sectional view of an exemplary module substrate that, in this example, sets out various layers in a multi-layer printed circuit board that supports devices of the module. It is possible for other substrates and types of substrates to be utilized. Typically, multi-layer printed circuit boards have multiple signal routing layers. In the exemplary multi-layer module, there are eight layers including: top and bottom conductive layers 400, 402, ground layers 404, a $V_{dd}$ layer, and internal signal routing layers 406, 408. Thus, in this example, there are what would be considered two internal signal routing layers. The individual layers of the module are separated from one another by a dielectric material which, in this example, is referred to as FR-4 (represented as $\epsilon_r$) which is a common dielectric material used in the industry.

In one particular RIMM® design, high-speed signals are provided on a so-called channel (referred to as a Rambus Channel) that contains multiple DRAMs. The high-speed signaling is accomplished using 30 high speed, controlled impedance, matched transmission lines (referred by as RSL levels for "Rambus Signaling Levels") that include the following lines: ClockToMaster (and its complement ClockToMasterN), ClockFromMaster (and its complement ClockFromMasterN), Data bus: DQA[8:0], DQB[8:0], and Address and Control bus ROW[2:0], COL[4:0]. High speed signals are defined as signals transmitting data at or above the bus clock frequency. The specifics of the operation of this particular Rambus design will be understood by those familiar with the system. For those not familiar with the system, information describing the operation of the system can be obtained from Rambus Inc., 2465 Latham Street, Mountain View, Calif., 94040, or on a company web site on the WWW at "rambus.com".

Typically, the RSL signals are routed in two internal layers within the module. In the FIG. 4 example, the RSL signals are received by the module and initially come into the top and bottom conductive layers 400, 402. Then, through vias (holes) that are provided in the module, the signals are provided onto the internal signal routing layers 406, 408. It is by virtue of the internal signal routing layers 406, 408 that the RSL signals are provided to the various devices (i.e. DRAMs) that are carried by the module. That is, these signal routing layers are connected at appropriate locations to the individual DRAM devices. The connections take place through vias in the module, as will be appreciated by those of skill in the art.

As indicated above, when the RSL signals are provided on the different internal signal routing layers, there can be propagation delay differences introduced by virtue of variations in the dielectric material that separates the conductive signal routing layers. It is undesirable to have propagation delay differences because such delay differences or skew adversely affects efficient utilization of a timing budget which defines timing parameters within which the system has to work.

Consider again FIG. 2, which illustrates two portions of a delay that might be expected on a module: $t_{p1,2}$ and $t_{p3,4}$. The delay portion $t_{p1,2}$ represents an "unloaded" portion of the delay. It is unloaded because there are no devices in the signal path on the module. The delay portion $t_{p3,4}$ represents the "loaded" portion of the delay. It is loaded because there are devices (i.e. DRAMs) in the signal path on the module. It has been found that the relative dielectric constant of FR-4 dielectric board material can vary from between 4.0 to 4.4 with a typical value of 4.2 at an operating frequency of 400 MHz. The total unloaded routed length of a 16-device RIMM® system is about 55 mm. The device pitch for a 16-device RIMM system is about 7.6 mm and the RDRAM (Rambus DRAM) device capacitance, Cd, is 2.5 pF, including the via. Given these assumptions, the delay for the unloaded portion can be calculated as follows:

Delay=length of trace/(speed of light in free space/$(\epsilon_r)^{1/2}$)

The delay for the loaded portion can be calculated as follows:

Delay=$(L*(C+Cd/pitch))^{1/2}*16*$pitch (where L and C are inductance and capacitance per unit length of the loaded trace)

Using a 16-device RIMM® module, the above equations result in the following values:

| | |
|---|---|
| Unloaded portion delay with relative dielectric constant of 4.4 ($T_{p1}$) | 384.6 ps |
| Unloaded portion delay with relative dielectric constant of 4.0 ($T_{p2}$) | 366.6 ps |
| Loaded portion delay with relative dielectric constant of 4.4 ($T_{p3}$) | 1556.8 ps |
| Loaded portion delay with relative dielectric constant of 4.0 ($T_{p4}$) | 1534.6 ps |

The timing skew can be calculated between the two groups of RSL signals by the following equation:

$$(T_{p1}-T_{p2})+(T_{p3}-T_{p4})=40 \text{ ps}$$

Thus, in this example, by the time the signals exit the module, there could be a timing offset or skew of around 40 ps between the two groups of RSL signals. This can effectively be multiplied if the RSL signals propagate through another module with a similar dielectric profile.

Routing Layer Switching to Reduce Skew

In accordance with the described embodiments, propagation skew between different groups of high speed signals is reduced by switching the individual signal groups between different routing layers so that part of the time, while the signals are on the module, the signals travel in one layer, and part of the time the signals travel in a different layer. By switching the signals between the different signal routing layers, skew that occurs from dielectric constant variation within the different dielectric layers can be reduced if not effectively eliminated.

Figure 5:
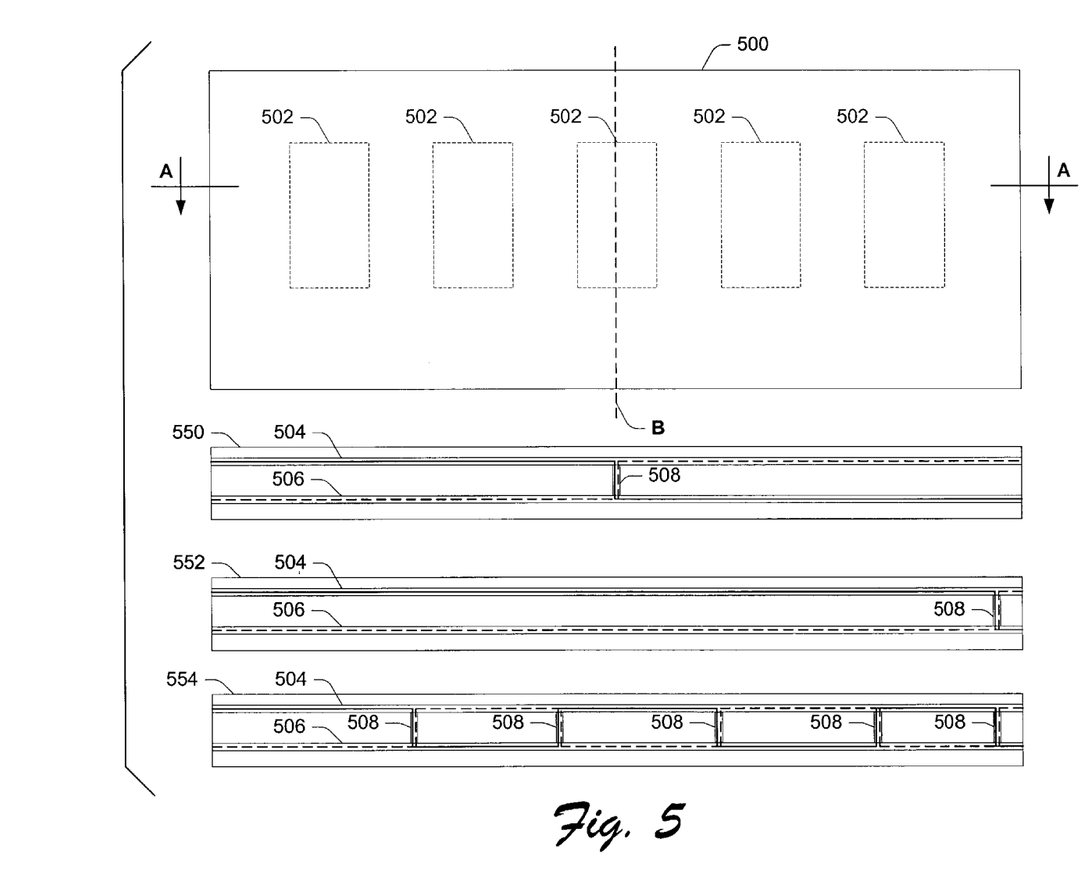
FIG. 5 is a plan view of an exemplary module, along with three accompanying sectional views taken along line A—A of the module. The sectional views each depict a different embodiment.

FIG. 5 shows an exemplary module 500 with five device outlines 502 positioned on the module. The module is formed by forming multiple signal routing layers within the module through conventional techniques. Multiple skew-reducing locations are formed on the module and are configured to enable high speed signals that are routed in two or more of the layers to be switched to a different signal routing layer. The skew-reducing locations, in the examples given below, comprise vias which are formed on the module through conventional techniques. Various layouts for the skew-reducing locations are described below.

The devices 502 are, or can be positioned on the module in a direction which, in this example, is the same direction as the long axis of the module. The device outlines represent, in this example, DRAM devices. Structures 550, 552, and 554 show simplified cross sections through the module that are taken along line A—A, and show different implementations of various routing layer switching schemes in accordance with the described embodiments.

Referring to structure 550, two internal signal routing layers 504, 506 are shown that extend longitudinally through the module. These routing layers correspond to layers 406, 408 respectively in FIG. 4. At approximately the mid-way point of the module, multiple skew-reducing locations in the form of vias are provided; an exemplary one of which is shown at 508. These multiple vias extend in a generally straight line transverse the long side of the module. Alternately, the line along which the vias extend is transverse the direction along which the devices 502 are arranged. The groups of high speed signals that are routed and traveling along the signal routing layers 504, 506 are switched, by way of these vias, from the layer in which they are traveling to a different layer. Specifically, in this example, the high speed signals that are traveling in layer 504 are switched to layer 506 proximate the midpoint of module 500. Similarly, the high speed signals that are traveling in layer 506 are switched to layer 504 proximate the midpoint of the module. The high speed signals are diagrammatically illustrated by the solid line extending within layer 504 (and switching to layer 506 through via 508), and the dashed line extending within layer 506 (and switching to layer 504 through a via that is different from the one shown in the drawing). The transition is diagrammatically depicted as taking place in the same via to assist the reader in understanding the principle of the routing layer switching.

It will be appreciated that this transition takes place, in a preferred implementation, for all of the high speed signals that are being routed though the module. Hence, the transition between the signal routing layers take place at approximately the same transverse location on the module. The transverse location for this example is shown by a dashed line designated "B". This is different from, and not to be confused with other layer changing schemes in which signal routing layers are changed for routing purposes only. In those schemes, there is no consideration given to the skewing that occurs. Accordingly, the decisions as to where to place the routing transitions do not take into account skewing issues and, from a skew-reduction standpoint can be considered as arbitrary. Here, in the preferred implementation, by virtue of the fact that all of the RSL signals are transitioned at approximately the same transverse location on the module, the skewing effects will be close to negligible. That is, assume that the dielectric properties of the dielectric material surrounding each signal routing layer having different dielectric profiles. By switching the high speed signals between the two layers at the mid-point of the module, the propagation delay difference, as between the signal groups, will be offset. Thus, the signals will generally tend to have little or no meaningful propagation delay.

In other embodiments, high speed signal switching between different layers can take place at any suitable point along the module. And, while this might not effectively offset the propagation delays, it is useful for reducing the propagation delays. For example, structure 552 shows a via 508 proximate an end of module 500, just after the loaded portion of the module. This via, and the others that are associated with it proximate the same transverse location on the module, can be utilized to effect the signal routing transition described above. Because the routing does not take place proximate the mid-point of the module, there may still be some skewing between the signal groups, albeit somewhat reduced.

Structure 554 provides multiple groups of vias 508 at multiple different transverse locations on module 500 that can be utilized to effect multiple different skew-reducing high speed signal transitions. In this embodiment, each of the transitions occurs proximate a device 502, or, the vias that provide connection between the internal signal layers and the DRAMs themselves could be used to effect signal transitions. Some of the transitions occur within the loaded portion of the module, while some of the transitions occur within the unloaded portion of the module. This embodiment recognizes the fact that skewing can occur within the module proximate each device. That is, each device can "see" a portion of the signal skewing that contributes to the overall skewing that is seen by the module. In this embodiment, a signal transition is made proximate each device so that the effects of skewing are minimized before the signals propagate to the next device.

Figure 6:
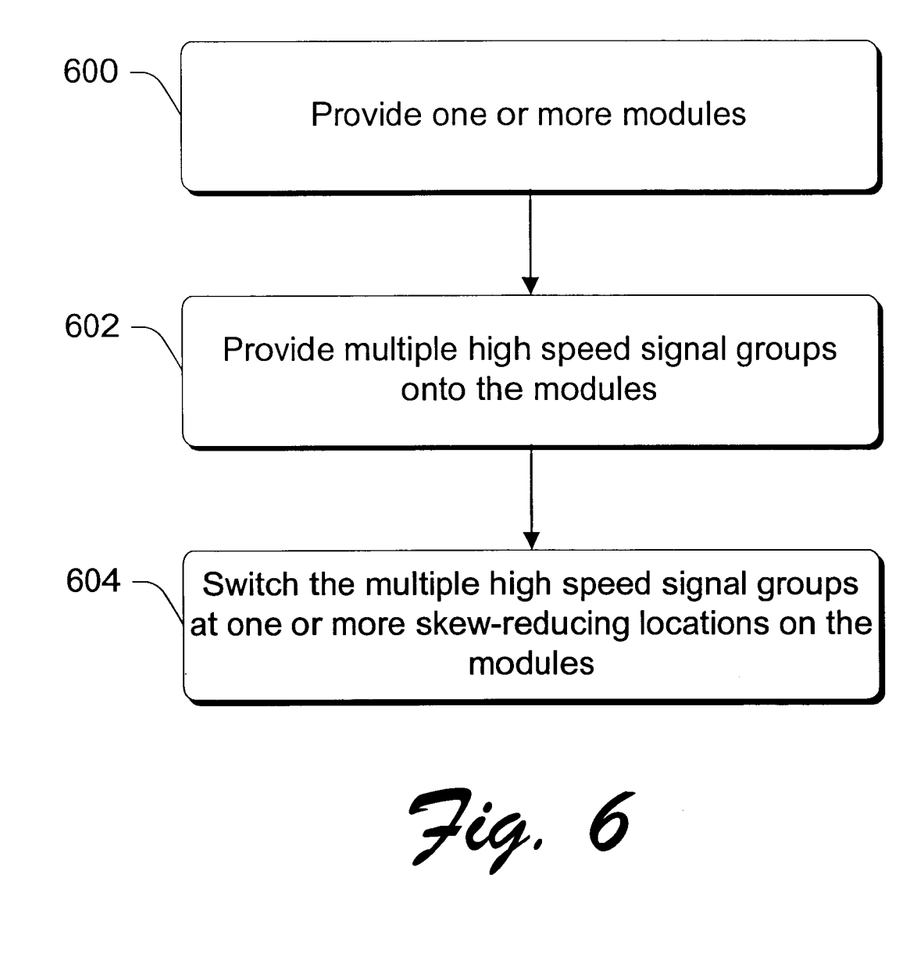
FIG. 6 is a flow diagram that describes steps in a method in accordance with the described embodiment.

FIG. 6 is a flow diagram that describes steps in a method in accordance with the described embodiments. Step 600 provides one or more modules. Exemplary modules include memory modules in the form of In-line Memory Modules (IMMs) such as RIMM® systems. Other modules can, of course, be utilized. Step 602 provides or routes multiple high speed signal groups on the module(s). These high speed signal groups can comprise any suitable high speed signal groups. In one particular example, the high speed signal groups comprise so-called RSL signals that are utilized in connection with a Rambus Channel. These high speed signal groups are provided onto the module and routed through the module using multiple different signal routing layers. An example of a system that utilizes two such signal routing layers is given above. It will be appreciated, however, that other numbers of signal routing layers can be used. Step 604 switches the multiple high speed signal groups between the different signal routing layers at one or more skew-reducing locations on the module. In the examples given above, skew-reducing locations include, without limitation, locations proximate the mid-point of the routing on the module, locations proximate the end of the loaded portion of the modules, and multiple different locations within the loaded and unloaded portions of the module. These multiple different locations can be selected so that the signal groups are switched proximate each device that is carried by the module, thus defining an alternating signal path through the different signal routing layers.

Conclusion

The inventive techniques described above can reduce propagation delays in signal groups that are routed in multiple different signal-routing layers. In the context of IMMs, the switching techniques assist in offsetting the effect of variations in dielectric material surrounding signal routing layers which, in turn, facilitates compliance with various timing budgets that govern operation of the IMMs.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A module comprising:
   an elongate module substrate having a long axis;
   multiple signal routing layers supported by the module substrate;
   multiple devices supported by the module substrate and operably connected with the signal routing layers; and
   multiple skew-reducing locations in which signals routed in two or more of the multiple signal routing layers can be switched to a different signal routing layer, the skew-reducing locations being arranged in at least one line that is generally transverse the long axis of the module substrate.

2. The module of claim 1, wherein said at least one line of skew-reducing locations is disposed proximate the middle of the module.

3. The module of claim 1, wherein said at least one line of skew-reducing locations is disposed proximate an end of the module.

4. The module of claim 1, wherein:
   one line of skew-reducing locations is disposed proximate the middle of the module; and
   one line of skew-reducing locations is disposed proximate an end of the module.

5. The module of claim 1, wherein the module comprises a loaded portion within which the devices are supported, and an unloaded portion which is outside of the loaded portion, and wherein said at least one line of skew-reducing locations is disposed within the loaded portion.

6. The module of claim 1, wherein the module comprises a loaded portion within which the devices are supported, and an unloaded portion which is outside of the loaded portion, and wherein said at least one line of skew-reducing locations is disposed within the unloaded portion.

7. The module of claim 1, wherein the module comprises a loaded portion within which the devices are supported, and an unloaded portion which is outside of the loaded portion, and wherein:
   one or more lines of skew-reducing locations are disposed within the unloaded portion; and
   one or more lines of skew-reducing locations are disposed within the loaded portion.

8. The module of claim 1, wherein multiple lines of skew-reducing locations are individually disposed between individual devices supported by the module.

9. The module of claim 1, wherein the module substrate comprises a printed circuit board.

10. A memory module comprising:
   a module substrate;
   multiple signal routing layers supported by the module substrate;
   multiple DRAM devices supported by the module substrate and operably connected with the signal routing layers, the DRAM devices being disposed on the module along a direction; and
   multiple skew-reducing locations in which signals routed in two or more of the multiple signal routing layers can be switched to a different signal routing layer, the skew-reducing locations being arranged in at least one line that is generally transverse the direction along which the DRAM devices are disposed.

11. The memory module of claim 10, wherein said at least one line of skew-reducing locations is disposed proximate the middle of the module.

12. The memory module of claim 10, wherein said at least one line of skew-reducing locations is disposed proximate an end of the module.

13. The memory module of claim 10, wherein;
   one line of skew-reducing locations is disposed proximate the middle of the module; and
   one line of skew-reducing locations is disposed proximate an end of the module.

14. The memory module of claim 10, wherein the module comprises a loaded portion within which the DRAM devices are supported, and an unloaded portion which is outside of the loaded portion, and wherein said at least one line of skew-reducing locations is disposed within the loaded portion.

15. The memory module of claim 10, wherein the module comprises a loaded portion within which the DRAM devices are supported, and an unloaded portion which is outside of the loaded portion, and wherein said at least one line of skew-reducing locations is disposed within the unloaded portion.

16. The memory module of claim 10, wherein the module comprises a loaded portion within which the DRAM devices are supported, and an unloaded portion which is outside of the loaded portion, and wherein:
   at least one line of skew-reducing locations is disposed within the loaded portion; and
   said at least one line of skew-reducing locations is disposed within the unloaded portion.

17. The memory module of claim 10, wherein multiple lines of skew-reducing locations are disposed between individual devices supported by the module.

18. The memory module of claim 10, wherein the module substrate comprises a printed circuit board.

19. A memory module comprising:
   an elongate module board having a long axis;
   a pair of signal routing layers supported by the module board;
   multiple memory devices supported by the module board and operably connected with the signal routing layers, the memory devices being disposed on the module board along a direction; and
   multiple skew-reducing locations in which signals routed in at least one of said signal routing layers can be switched to a different signal routing layer, the skew-reducing locations being arranged in at least one line that is generally transverse the direction along which the memory devices are disposed.

20. The memory module of claim 19, wherein the direction along which the memory devices are disposed is in the same direction as the long axis of the module board.

21. The memory module of claim 19, wherein the memory devices comprise DRAM devices.

22. A high frequency system comprising:
   a motherboard;
   a master controller mounted on the motherboard;
   one or more modules mounted on the motherboard and operably connected to the master controller and configured to receive high speed signals from the master controller, each module comprising:
   an elongate module board;
   multiple signal routing layers supported by the module board;
   multiple devices supported by the module board and operably connected with the signal routing layers; and
   multiple skew-reducing locations in which signals routed in two or more of the multiple signal routing layers can be switched to a different signal routing layer, the skew-reducing locations being arranged in at least one line that is generally transverse the module board.

23. The high frequency system of claim 22, wherein, for at least one module, said at least one line of skew-reducing locations is disposed proximate the middle of the module.

24. The high frequency system of claim 22, wherein, for at least one module, said at least one line of skew-reducing locations is disposed proximate an end of the module.

25. The high frequency system of claim 22, wherein, for at least one module:
   one line of skew-reducing locations is disposed proximate the middle of the module; and
   one line of skew-reducing locations is disposed proximate an end of the module.

26. The high frequency system of claim 22, wherein, for at least one module, the module comprises a loaded portion within which the devices are supported, and an unloaded portion which is outside of the loaded portion, and wherein said at least one line of skew-reducing locations is disposed within the loaded portion.

27. The high frequency system of claim 22, wherein, for at least one module, the module comprises a loaded portion within which the devices are supported, and an unloaded portion which is outside of the loaded portion, and wherein said at least one line of skew-reducing locations is disposed within the unloaded portion.

28. The high frequency system of claim 22, wherein, for at least one module, the module comprises a loaded portion within which the devices are supported, and an unloaded portion which is outside of the loaded portion, and wherein:
   one or more lines of skew-reducing locations are disposed within the loaded portion; and
   one or more lines of skew-reducing locations are disposed within the unloaded portion.

29. A high frequency system comprising:
   a motherboard;
   a memory controller mounted on the motherboard;
   one or more memory modules mounted on the motherboard and operably connected to the memory controller and configured to receive high speed signals from the memory controller, each memory module comprising:
   a module board;
   multiple signal routing layers supported by the module board;

multiple DRAM devices supported by the module board and operably connected with the signal routing layers, the DRAM devices being disposed on the module board along a direction; and multiple skew-reducing locations in which signals routed in two or more of the multiple signal routing layers can be switched to a different signal routing layer, the skew-reducing locations being arranged in at least one line that is generally transverse the direction along which the DRAM devices are disposed.

30. The high frequency system of claim 29, wherein, for at least one memory module, said at least one line of skew-reducing locations is disposed proximate the middle of the memory module.

31. The high frequency system of claim 29, wherein, for at least one memory module, said at least one line of skew-reducing locations is disposed proximate an end of the memory module.

32. The high frequency system of claim 29, wherein, for at least one memory module,
at least one line of skew-reducing locations is disposed proximate the middle of the memory module; and
at least one line of skew-reducing locations is disposed proximate an end of the memory module.

33. The high frequency system of claim 29, wherein, for at least one memory module, the memory module comprises a loaded portion within which the DRAM devices are supported, and an unloaded portion which is outside of the loaded portion, and wherein said at least one line of skew-reducing locations to is disposed within the loaded portion.

34. The high frequency system of claim 29, wherein, for at least one memory module, the memory module comprises a loaded portion within which the DRAM devices are supported, and an unloaded portion which is outside of the loaded portion, and wherein said at least one line of skew-reducing locations is disposed within the unloaded portion.

35. The high frequency system of claim 29, wherein, for at least one memory module, the memory module comprises a loaded portion within which the DRAM devices are supported, and an unloaded portion which is outside of the loaded portion, and wherein:
at least one line of skew-reducing locations is disposed within the loaded portion; and
at least one line of skew-reducing locations is disposed within the unloaded portion.

36. A high frequency system comprising:
a motherboard;
a memory controller mounted on the motherboard; and
one or more memory modules mounted on the motherboard and operably connected to the memory controller and configured to receive high speed signals from the memory controller, each memory module comprising:
an elongate module board having a long axis;
a pair of signal routing layers supported by the module board;
multiple memory devices supported by the module board and operably connected with the signal routing layers, the memory devices being disposed on the module board along a direction; and
multiple skew-reducing locations in which signals routed in at least one of said signal routing layers can be switched to a different signal routing layer, the skew-reducing locations being arranged in at least one line that is generally transverse the direction along which the memory devices are disposed.

37. The high frequency system of claim 36, wherein for at least one memory module, the direction along which the memory devices are disposed is in the same direction as the long axis of the module board.

38. The high frequency system of claim 36, wherein the memory devices comprise DRAM devices.

39. A skew-reducing, signal routing method comprising:
routing multiple groups of high speed signals in at least one module, individual modules comprising an elongate module board, multiple signal routing layers supported by the module board, multiple devices supported by the module board and operably connected with the signal routing layers, and multiple skew-reducing locations in which signals routed in two or more of the multiple signal routing layers can be switched to a different signal routing layer, the skew-reducing locations being arranged in at least one line that is generally transverse the nodule board; and
switching the multiple groups of high speed signals between the signal routing layers.

40. The skew-reducing, signal routing method of claim 39, wherein said at least one line of skew-reducing locations is disposed proximate the middle of the module.

41. The skew-reducing, signal routing method of claim 39, wherein said at least one line of skew-reducing locations is disposed proximate an end of the module.

42. The skew-reducing, signal routing method of claim 39, wherein the module comprises a loaded portion within which the devices are supported, and an unloaded portion which is outside of the loaded portion, and wherein said at least one line of skew-reducing locations is disposed within the loaded portion.

43. The skew-reducing, signal routing method of claim 39, wherein the module comprises a loaded portion within which the devices are supported, and an unloaded portion which is outside of the loaded portion, and wherein said at least one line of skew-reducing locations is disposed within the unloaded portion.

44. A skew-reducing, signal routing method comprising:
routing multiple groups of high speed signals in at least one memory module, individual memory modules comprising a module board, multiple signal routing layers supported by the module board, multiple DRAM devices supported by the module board and operably connected with the signal routing layers, the DRAM devices being disposed on the module board along a direction, and multiple skew-reducing locations in which signals routed in two or more of the multiple signal routing layers can be switched to a different signal routing layer, the skew-reducing locations being arranged in at least one line that is generally transverse the direction along which the DRAM devices are disposed; and
switching the multiple groups of high speed signals between the signal routing layers.

45. The skew-reducing, signal routing method of claim 44, wherein said at least one line of skew-reducing locations is disposed proximate the middle of the module.

46. The skew-reducing, signal routing method of claim 44, wherein said at least one line of skew-reducing locations is disposed proximate an end of the module.

47. The skew-reducing, signal routing method of claim 44, wherein:
one line of skew-reducing locations is disposed proximate the middle of the module; and
one line of skew-reducing locations is disposed proximate an end of the module.

48. The skew-reducing, signal routing method of claim 44, wherein the module comprises a loaded portion within which the DRAM devices are supported, and an unloaded portion which is outside of the loaded portion, and wherein said at least one line of skew-reducing locations is disposed within the loaded portion.

49. The skew-reducing, signal routing method of claim 44, wherein the module comprises a loaded portion within which the DRAM devices are supported, and an unloaded portion which is outside of the loaded portion, and wherein said at least one line of skew-reducing locations is disposed within the unloaded portion.

50. A method of forming a skew-reduced memory module board comprising:

forming multiple signal routing layers within a memory module board which is configured to support multiple memory devices that can be arranged on the memory module board in a direction;

forming multiple skew-reducing locations on the memory module board that are configured to enable high speed signals that are routed in two or more of the signal routing layers to be switched to a different signal routing layer;

the skew-reducing locations being arranged in at least one line that is disposed generally transverse the direction in which the memory devices are arranged.

51. The method of claim 50 wherein the forming of the multiple skew-reducing locations comprises forming the locations so that one line is disposed in the middle of the memory module board.

52. The method of claim 50 wherein the forming of the multiple skew-reducing locations comprises forming the locations so that one line is disposed toward the end of the memory module board.

53. The method of claim 50 wherein the forming of the multiple skew-reducing locations comprises:

forming some locations so that one line is disposed in the middle of the memory module board; and forming other locations so that another line is disposed toward the end of the memory module board.

54. The method of claim 50 wherein the forming of the multiple skew-reducing locations comprises forming locations so that multiple lines are formed within the memory module board.

* * * * *

UNITED STATES PATENT AND TRADEMARK OFFICE
CERTIFICATE OF CORRECTION

PATENT NO. : 6,681,338 B1
DATED : January 20, 2004
INVENTOR(S) : Kollipara

It is certified that error appears in the above-identified patent and that said Letters Patent is hereby corrected as shown below:

Title page,
Item [54], Title, replace "METHOD AND SYSTEM" with -- METHODS AND SYSTEMS --.

Column 12,
Line 17, replace "nodule" with -- module --.

Signed and Sealed this

Twenty-second Day of June, 2004

JON W. DUDAS
*Acting Director of the United States Patent and Trademark Office*